United States Patent
Cho

[11] Patent Number: 5,597,462
[45] Date of Patent: Jan. 28, 1997

[54] CONDENSING DEVICE FOR SPUTTERING DEVICE

[75] Inventor: Gyoung S. Cho, Ichon-kun, Rep. of Korea

[73] Assignee: Hyundai Electronics Industries Co., Ltd., Rep. of Korea

[21] Appl. No.: 265,659

[22] Filed: Jun. 24, 1994

[30] Foreign Application Priority Data

Jun. 24, 1993 [KR] Rep. of Korea ............... 93-11254

[51] Int. Cl.⁶ .................................. C23C 14/34
[52] U.S. Cl. ...................................... 204/298.11
[58] Field of Search .................. 204/298.11, 298.06, 204/192.12, 298.01

[56] References Cited

U.S. PATENT DOCUMENTS 3,654,110  4/1972  Kraus ................. 204/192.12
4,824,544  4/1989  Mikalesen et al. ......... 204/298.11
5,223,108  6/1993  Hurwitt ................. 204/298.11

*Primary Examiner*—R. Bruce Breneman
*Assistant Examiner*—Rodney G. McDonald
*Attorney, Agent, or Firm*—Merchant, Gould, Smith, Edell, Welter & Schmidt

[57] ABSTRACT

A condensing device for a sputtering device capable of condensing metal atoms to be ejected from a metal target onto a semiconductor substrate in a scattered manner and thereby easily depositing the metal atoms on side walls of contact holes formed at the semiconductor substrate is disclosed. The condensing device includes a plurality of condensing tubes arranged in the form of a bundle and adapted to condense the metal atoms ejected from the metal target, each of the condensing tubes being constituted by a set of condensing plates, and a plurality of inclination adjusting plates each interposed between adjacent ones of the condensing tubes and adapted to incline each of the adjacent condensing tubes at an angle ranging between 0° to 15°.

5 Claims, 4 Drawing Sheets

5,597,462

CONDENSING DEVICE FOR SPUTTERING DEVICE

BACKGROUND OF THE INVENTION

1. Field of the Invention

The present invention relates to a sputtering device constituting a part of an apparatus for fabricating a semiconductor device, to eject atoms of a metal onto a semiconductor substrate, and more particularly, to a condensing device for ejecting metal atoms from a metal target onto a semiconductor substrate.

2. Description of the Prior Art

As the degree of semiconductor device integration increases, the dimensions of its contact dimensions are correspondingly reduced while the aspect ratio of the contact is correspondingly increased. In accordance with a semiconductor device employing metal wiring, aluminum alloy is typically used. When forming the metal wiring, aluminum alloy is generally deposited over a substrate using a sputtering process. Adherence of sputtered metal to the substrate, however, is generally regarded to be a limiting factor. Depositing aluminum alloy on the side walls and bottom of contacts formed on the substrate is difficult. This problem becomes more severe as the dimensions of each contact are reduced.

FIG. 1 is a schematic view of a sputtering device employing a conventional condensing device. As shown in FIG. 1, the condensing device, which is denoted by the reference numeral 12, includes a plurality of condensing plates 14 arranged vertically above a substrate 13.

In accordance with a conventional sputtering process, metal atoms are ejected from a metal target 11 disposed directly above a set of condensing plates 14 and then deposited over a substrate 13. Although the condensing plates 14 guide the metal atoms in a vertically downward direction, the metal atoms are generally not deposited in a completely linear manner. Rather, they are deposited in a more or less dispersed manner. This dispersion of metal atoms results from collision of the metal atoms with other metal atoms or with $Ar^+$ ions of the sputtering gas.

FIG. 2 is a plan view of the conventional condensing device shown in FIG. 1. As shown in FIG. 2, condensing device 12 includes a bundle of condensing tubes each having a regular hexagonal shape constituted by a set of condensing plates 14.

Where a sputtering process is carried out by use of a condensing device 12 having its condensing plates 14 arranged vertically above substrate 13, only the metal atoms exhibiting a substantially vertical orientation are deposited over substrate 13. As a result, a large amount of metal is deposited on the bottom of each contact, as compared to the case where no condensing device 12 is employed. At the side walls of the contact, however, it is difficult to deposit a sufficient thickness of metal to the extent as the thickness of metal deposited on the bottom of the contact. When planarizing both the contact bottom surface and the contact side wall surface, it is desirable that the metal atoms be deposited on the contact side wall surface in an amount similar to that deposited on the contact bottom surface. However, this can not be achieved by the condensing device 12 employed in the above-mentioned conventional sputtering device having its condensing plates 14 arranged vertically above the substrate.

SUMMARY OF THE INVENTION

Therefore, an objective of the invention is to provide a condensing device for a sputtering device capable of condensing metal atoms to be ejected from a metal target onto a semiconductor substrate in a scattered manner and thereby easily depositing the metal atoms on side walls of contact holes formed at the semiconductor substrate.

In accordance with the present invention, this object can be accomplished by providing, in a sputtering device including a metal target for ejecting metal atoms therefrom onto a semiconductor substrate, a condensing device comprising: a plurality of condensing tubes arranged in the form of a bundle and adapted to condense the metal atoms ejected from the metal target, each of the condensing tubes being constituted by a set of condensing plates; and a plurality of inclination adjusting plates each interposed between adjacent ones of the condensing tubes and adapted to incline each of the adjacent condensing tubes at a predetermined angle.

BRIEF DESCRIPTION OF THE DRAWINGS

Other object and aspects of the invention will become apparent from the following description of the embodiments with reference to the accompanying drawings in which.

DETAILED DESCRIPTION OF THE PREFERRED EMBODIMENTS

Figure 1:
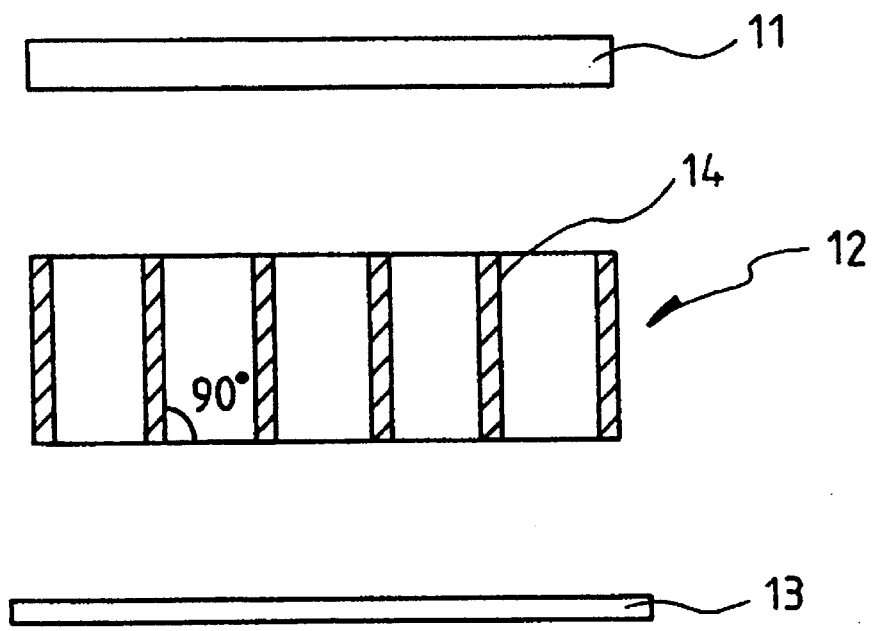
FIG. 1 is a schematic view of a sputtering device employing a conventional condensing device.
Figure 2:
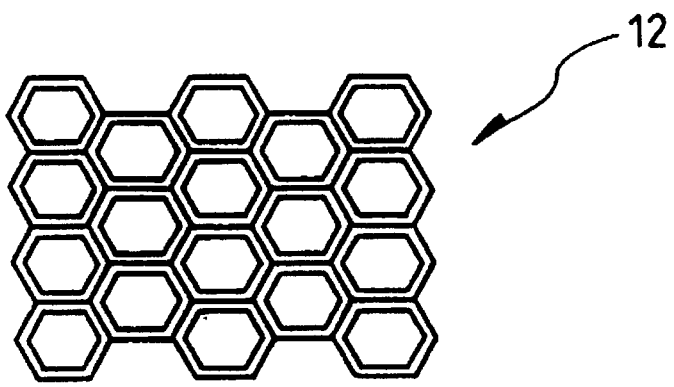
FIG. 2 is a plan view of the conventional condensing device shown in FIG. 1.
Figure 3:
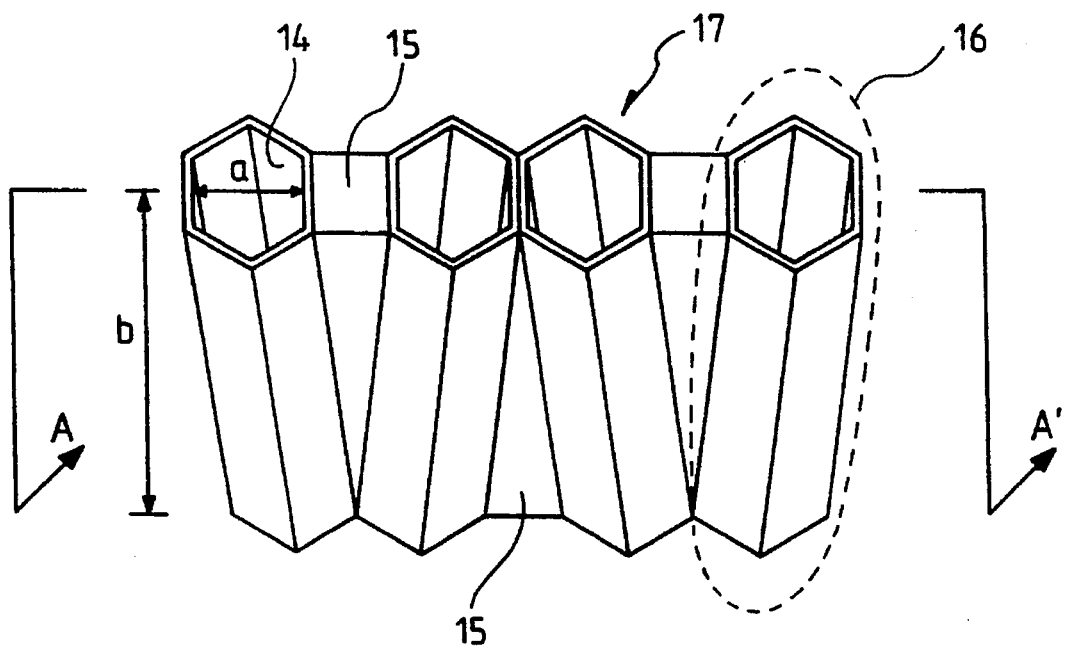
FIG. 3 is a perspective view of a sputtering device employing a condensing device in accordance with embodiments of the present invention.
Figure 4:
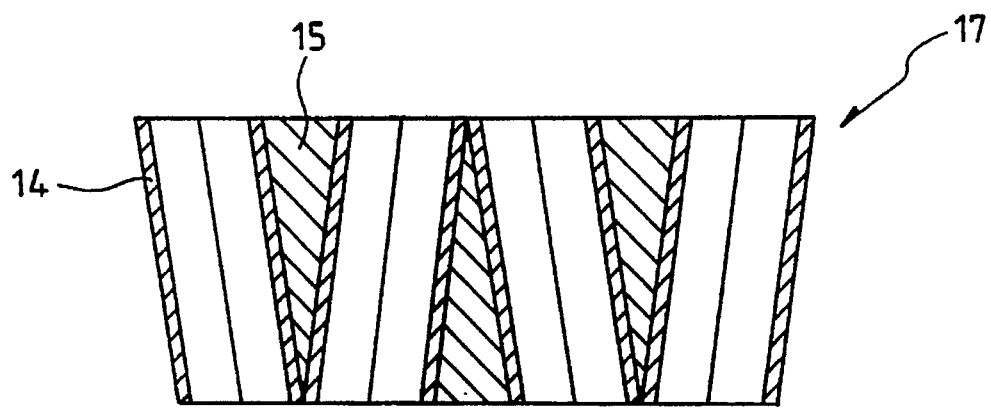
FIG. 4 is a cross-sectional view taken along the line A—A of FIG. 3.

FIG. 3 is a perspective view of a sputtering device employing a condensing device in accordance with embodiments of the present invention. FIG. 4 is a cross-sectional view taken along the line A—A of FIG. 3. In the following description, elements respectively corresponding to those described in conjunction with FIGS. 1 and 2 are designated by the same reference numerals.

As shown in FIGS. 3 and 4, the condensing device, which is denoted by the reference numeral 17, is of an inclined construction. The inclined condensing device 17 includes a plurality of condensing tubes 16 coupled with one another to be constructed in the form of a bundle.

Each of the condensing tubes 16 is inclined at a predetermined angle with respect to a vertical line, or longitudinal axis, defining the condensing tubes 16 such that metal atoms ejected from a metal target 11 are oriented toward side wall portions of contacts formed on the semiconductor substrate 13. Each condensing tube 16 is constituted by a set of condensing plates 14. Between adjacent condensing tubes 16, an inclination adjusting plate 15 is interposed.

Each condensing tube 16 is preferably constituted by a set of condensing plates 14 that may have a regular hexagonal cross-section. Taking into consideration the condensing effect, the cross-section of each condensing tube 16 may have other shapes, such as an oblongish hexagonal shape, a circular shape, and a rectangular shape, for example.

Figure 5:
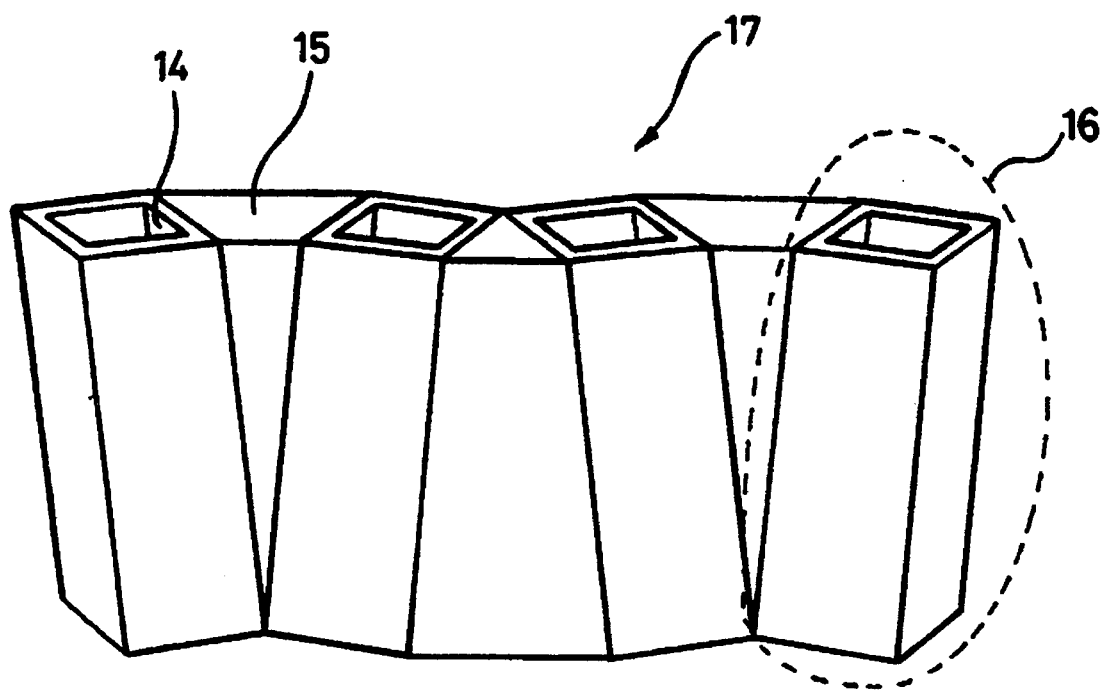
FIG. 5 is a perspective view of an alternative embodiment of a condensing device in accordance with the present invention.
Figure 6:
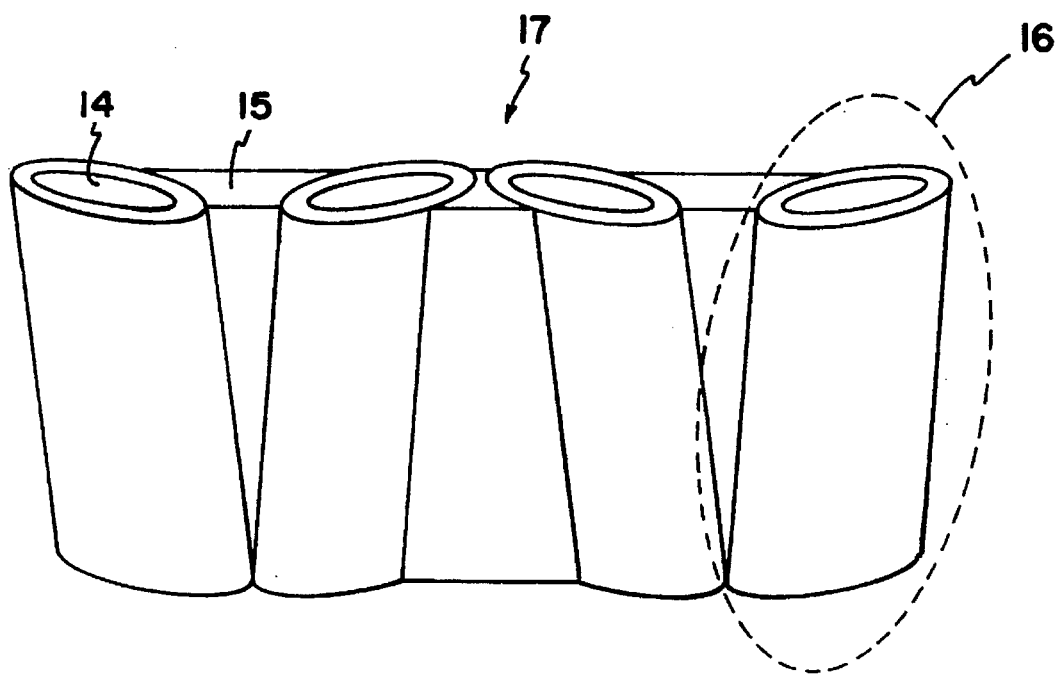
FIG. 6 is a perspective view of another embodiment of a condensing device in accordance with the present invention.

In FIG. 5, for example, the condensing tubes 16 have a rectangular cross-section. The condensing tubes 16 shown in FIG. 6, by way of further example, have a circular cross-section.

The distance a between facing condensing plates 14 of each condensing tube 16 and the vertical height b may be appropriately adjusted under the existing conditions. Generally, the amount of metal atoms deposited on the condensing plates 14 is increased as the aspect ratio b/a, indicative of the length-to-width ratio of each condensing tube 16, is increased. In this case, the deposition rate of metal atoms during sputtering is decreased. In contrast, where the aspect ratio b/a is too small, or where the inclination of each condensing tube 16 is too large, the contacts formed on the substrate may exhibit poor step coverage. In this case, the deposition rate is also greatly decreased. Accordingly, the degree of inclination of each condensing tube 16 preferably ranges substantially between 0° and 15°. Adjacent ones of the condensing tube 16 are preferably inclined in opposition to each other. It is noted that the condensing plates 14 may be made of stainless steel.

When a metal thin film is sputtered on the contacts formed on the substrate by use of the sputtering device equipped with the novel inclined condensing device 17, metal atoms are adjusted in orientation to move toward the side wall portions of the contacts by the condensing tubes 16. As a result, the metal thin film is thickly deposited on the side walls of the contacts, as contrasted to the case using a conventional condensing device.

Even in the fabrication of a semiconductor device having a high degree of integration, such as the dynamic random access memory of 64 mega-grade or greater, a metal thin film can be deposited on the contact side walls to a sufficient thickness, as well as the contact bottoms, when a double sputtering process is carried out on the contacts using a novel inclined condensing device 17 in accordance with the present invention. Accordingly, it is possible to improve the step coverage of the metal thin film and thereby greatly improve the reliability of the semiconductor device. Furthermore, a subsequent planarization by an oxide film can be more easily achieved.

Although the preferred embodiments of the invention have been disclosed for illustrative purposes, those skilled in the art will appreciate that various modifications, additions, and substitutions are possible, without departing from the scope and spirit of the present invention as disclosed in the accompanying claims.

I claim:

1. A condensing device for use in a sputtering apparatus having a metal target for ejecting metal atoms therefrom onto a semiconductor substrate, the condensing device comprising:

a plurality of condensing tubes arranged in a bundle and adapted to condense the metal atoms ejected from the metal target, each of the condensing tubes comprising a set of condensing plates; and a plurality of inclination adjusting plates each interposed between adjacent ones of the condensing tubes and adapted to incline each of the adjacent condensing tubes at a predetermined angle.

2. The condensing device in accordance with claim 1, wherein each of the condensing tubes is inclined at an angle greater than 0° but less than or equal to 15°.

3. The condensing device in accordance with claim 1, wherein the adjacent ones of the condensing tubes are inclined in opposition to each other.

4. The condensing device in accordance with claim 1, wherein each of the condensing tubes has a cross-section having a shape selected from a group consisting of a regular hexagonal shape, an oblong-hexagonal shape, a circular shape, and a rectangular shape.

5. The condensing device in accordance with claim 1, wherein the condensing plates comprise stainless steel.

\* \* \* \* \*